United States Patent
Cao et al.

(10) Patent No.: US 6,281,102 B1
(45) Date of Patent: Aug. 28, 2001

(54) COBALT SILICIDE STRUCTURE FOR IMPROVING GATE OXIDE INTEGRITY AND METHOD FOR FABRICATING SAME

(75) Inventors: Wanqing Cao, Portland; Sang-Yun Lee, Hillsboro; Guo-Qiang Lo, Portland; Shih-Ked Lee, Beaverton, all of OR (US)

(73) Assignee: Integrated Device Technology, Inc., Santa Clara, CA (US)

( * ) Notice: Subject to any disclaimer, the term of this patent is extended or adjusted under 35 U.S.C. 154(b) by 0 days.

(21) Appl. No.: 09/484,580

(22) Filed: Jan. 13, 2000

(51) Int. Cl.$^7$ ..................... H01L 21/3205; H01L 21/44; H01L 21/4763

(52) U.S. Cl. .................. 438/592; 438/630; 438/664; 438/660; 438/683

(58) Field of Search ..................................... 438/143, 180, 438/402, 476, 592, 630, 636, 655–656, 664, 683, 299, 300, 301, 564, 672, 692, 660, 663

(56) References Cited

U.S. PATENT DOCUMENTS

| | | |
|---|---|---|
| 5,384,285 | 1/1995 | Sitaram et al. . |
| 5,395,798 | 3/1995 | Havemann . |
| 5,403,759 | 4/1995 | Havemann . |
| 5,834,356 | 11/1998 | Bothra et al. . |
| 5,866,459 * | 2/1999 | Naem et al. .................... 438/300 |
| 5,989,988 | 11/1999 | Iinuma et al. . |
| 6,074,486 * | 6/2000 | Yang et al. .................... 118/719 |
| 6,146,983 | 11/2000 | Gardner et al. . |

OTHER PUBLICATIONS

Flinn, et al., "Measurement and Interpretation of Stress in Aluminum–Based Metallization as a Function of Thermal History," IEEE Transactions on Electron Devices, 34th ed., p. 689–699, (Mar., 1987).

IInuma, et al., "Highly Uniform Heteroepitaxy of Cobalt Silicide by Using Co–Ti Alloy for Sub–quarter Micron Devices," 1998 Symposium on VlSI Technology, p. 188–189, (1998).

(List continued on next page.)

*Primary Examiner*—Matthew Smith
*Assistant Examiner*—Calvin Lee
(74) *Attorney, Agent, or Firm*—Bever, Hoffman & Harms, LLP

(57) ABSTRACT

An improved method is provided for fabricating a cobalt silicide structure that includes the steps of: (1) forming a silicon structure, wherein a native oxide is located over a first surface of the silicon structure, (2) loading the silicon structure into a chamber, (3) introducing a vacuum to the chamber, (4) depositing a titanium layer over the first surface of the silicon structure, wherein the thickness of the titanium layer is selected to remove substantially all of the native oxide, (5) depositing a cobalt layer over the titanium layer, (6) depositing an oxygen impervious cap layer over the cobalt layer; and then (7) breaking the vacuum in the chamber, and (8) subjecting the silicon structure, the titanium layer, the cobalt layer and the cap layer to an anneal, thereby forming the cobalt silicide structure. The cap layer can be, for example, titanium or titanium nitride. The resulting cobalt silicide structure is substantially free from oxygen (i.e., oxide). Consequently, an underlying gate oxide or substrate is advantageously protected from the effects of cobalt silicide spiking.

19 Claims, 2 Drawing Sheets

OTHER PUBLICATIONS

Byun, et al., "Defect Generation during Epitaxial CoSi2 Formation Using Co/Ti Bilayer on Oxide Patterned (100)Si Substrate and Its Effect on the Electrical Properties," J. Electrochem, Soc., vol. 143, No. 3, Mar. 1996, p. L56–L58.

Wang et al., "New CoSi2 Salicide Technology for 0.1 um Processes and Below," 1995 Symposium on VLSI Technology, p. 17–18.

Dass, et al., "Gowth of epitaxial CoSi2 on (100) Si," Appl. Phys. Lett, vol. 58, No. 12, Mar. 25, 1991, p. 1308–1310.

Alberti, et al., "Reaction and thermal stability of cobalt disilicide on polysilicon resulting from a Si/Ti/Co multilayer system," J. Vac. Sci. Technol. B17(4), Jul./Aug. 1999, p. 1448–1455.

"High Conductivity Nickel Silicide Polycide Gates For Sub–Micron Field Effect Transistors", IBM Technical Disclosure Bulletin; Dec. 1989.

* cited by examiner

COBALT SILICIDE STRUCTURE FOR IMPROVING GATE OXIDE INTEGRITY AND METHOD FOR FABRICATING SAME

BACKGROUND OF THE INVENTION

1. Field of the Invention

The present invention relates to a silicide semiconductor structure. More specifically, the present invention relates to a cobalt silicide structure for use in processes having a minimum line width less than 0.25 microns.

2. Discussion of Related Art

As semiconductor processing techniques improve, the minimum feature size that can be produced by a semiconductor process decreases. Semiconductor processes are typically defined by minimum feature size (i.e., 0.5 micron process, 0.35 micron process, 0.25 micron process, 0.18 micron process). As the minimum feature size of semiconductor processes decreases, so does the width of the conductive elements formed by the process. As a result, the resistances of the conductive structures undesirably increase.

One example of a conductive element is a metal silicide structure, which is fabricated by reacting silicon with a refractory metal. Semiconductor processes having a minimum feature size of 0.25 microns or greater typically use titanium silicide ($TiSi_2$). A titanium silicide structure is typically formed by depositing a layer of titanium over a layer of polycrystalline silicon and annealing the resulting structure. Titanium can be deposited over the polysilicon layer, even if there is a native oxide layer over the upper surface of the polysilicon layer, because the titanium will getter (i.e., remove) the native oxide layer. However, as the minimum feature size decreases below 0.25 microns, it becomes increasingly more difficult to maintain the low resistance of titanium silicide. Consequently, other elements have been used to replace the titanium.

One such element is cobalt. However, while cobalt silicide has a lower resistivity than titanium silicide when formed on small geometries, there are several problems associated with the use of cobalt to form a metal silicide structure. First, cobalt is incapable of gettering oxygen in the same manner as titanium. As a result, the upper surface of a polysilicon layer must be thoroughly cleaned prior to depositing cobalt. This cleaning adds to the complexity of the process. Any oxide left on top of the polysilicon layer can cause problems. For example, the cobalt can migrate to the areas where the native oxide does not exist, thereby resulting in the formation of cobalt silicide spikes that extend through the polysilicon layer to underlying gate oxide or silicon. If the cobalt silicide spikes reach an underlying gate oxide layer, undue stress is placed on the gate oxide layer, thereby causing the gate oxide to fail. If the cobalt silicide spikes reach an underlying silicon substrate, a short will exist between the metal silicide structure and the underlying substrate, thereby resulting in excessive leakage current. A thin titanium layer has been proposed between the cobalt layer and the polysilicon layer. (See, M. Lawrence, A. Dass, D. B. Fraser and C. S. Wei, "Growth of epitaxial $CoSi_2$ on (100) Si", Appl. Phys. Lett., 58, pp. 1308–1310 (1991).

In addition, when the cobalt and polysilicon layer are annealed in the presence of oxygen, it is possible for the ambient oxygen to diffuse through the cobalt to the cobalt-polysilicon interface. Under these conditions, silicon oxide can be formed at the cobalt-polysilicon interface. The presence of silicon oxide at the cobalt-polysilicon interface can cause the same problems caused by the presence of native oxide on the upper surface of the polysilicon layer. Some conventional processes provide for a capping layer over the cobalt layer to prevent ambient oxygen from diffusing through the cobalt layer to the cobalt-polysilicon interface. One such process is described in U.S. Pat. No. 5,384,285 to Sitaram et al.

It would therefore be desirable to have a method for forming a cobalt silicide structure that solves the above-described problems.

SUMMARY

Accordingly, the present invention provides an improved method of fabricating a cobalt silicide structure that includes the steps of: (1) forming a silicon structure, wherein a native oxide is located over a first surface of the silicon structure, (2) loading the silicon structure into a chamber, (3) introducing a vacuum to the chamber, (4) depositing a titanium layer over the first surface of the silicon structure, wherein the thickness of the titanium layer is selected to remove substantially all of the native oxide, (5) depositing a cobalt layer over the titanium layer, (6) depositing an oxygen impervious cap layer over the cobalt layer; and then (7) breaking the vacuum in the chamber, and (8) subjecting the silicon structure, the titanium layer, the cobalt layer and the cap layer to an anneal, thereby forming the cobalt silicide structure. The cap layer can be, for example, titanium or titanium nitride.

The resulting cobalt silicide structure is substantially free from oxygen (i.e., oxide). Consequently, an underlying gate oxide or substrate is advantageously protected from the effects of cobalt silicide spiking.

The present invention will be more fully understood in view of the following description and drawings.

DETAILED DESCRIPTION

Figure 1:
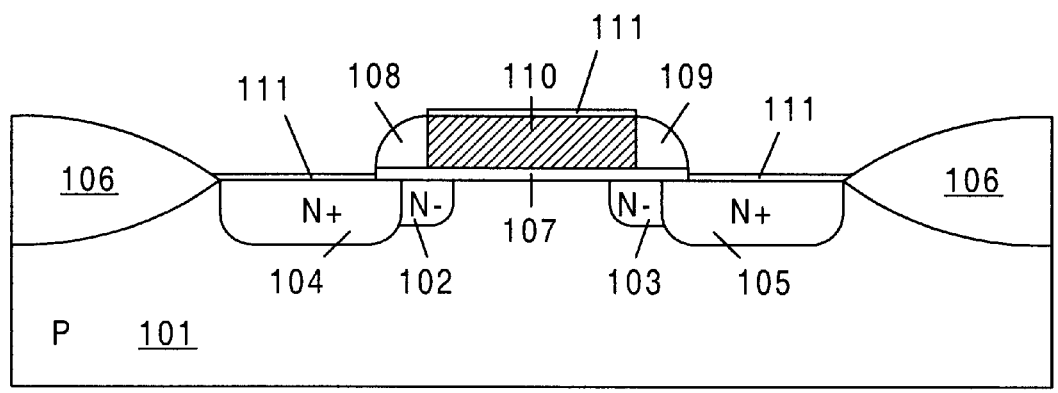
FIGS. 1–6 are cross sectional views of a transistor during various stages of fabrication in accordance with one embodiment of the present invention.

FIGS. 1–6 are cross sectional views of a transistor 100 during various stages of fabrication in accordance with one embodiment of the present invention. As shown in FIG. 1, lightly doped n-type source/drain regions 102–103 and heavily doped n-type source/drain regions 104–105 are formed in a p-type monocrystalline silicon region 101. Silicon region 101 can be, for example, a p-type substrate or a p-well region. Source/drain regions 102–105 are located in an active region defined by field oxide 106. A gate oxide layer 107 is formed over semiconductor region 101. In the described embodiment, gate oxide layer 107 is formed from silicon oxide. A conductively doped polysilicon structure 110 is formed over gate oxide layer 107. Sidewall spacers 108–109 are formed on either side of polysilicon structure 110. In the described embodiment, sidewall spacers 108–109 are formed from silicon nitride, silicon oxide, or a combination of both. The structure of FIG. 1 is fabricated using conventional semiconductor processing steps that are well known to one of ordinary skill in the art.

In order to form a metal salicide layer over the exposed silicon regions 104, 105 and 110, the structure of FIG. 1 must be transported through the ambient atmosphere to a vacuum chamber where a refractory metal is deposited over the resulting structure. (Note that salicide is a term used to describe self-aligned silicide). Exposure to the ambient atmosphere results in the formation of native silicon oxide 111 on the exposed surfaces of silicon regions 104, 105 and 110. Native oxide 111 typically has a thickness of about 0.8 to 1.0 nm.

Figure 2:
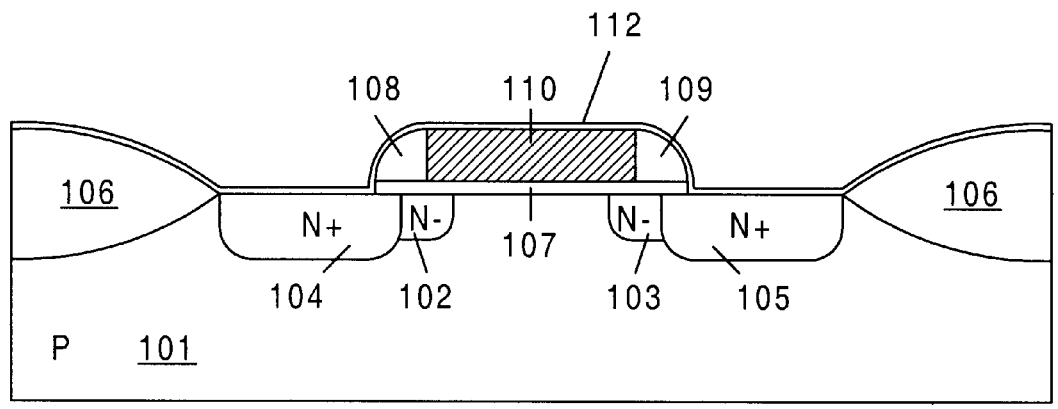

As illustrated in FIG. 2, after the resulting structure is loaded into the vacuum chamber, a vacuum is established and a thin layer of titanium 112 is deposited over the resulting structure. In the described embodiment, titanium layer 112 is desposited by sputtering. More specifically, titanium layer 112 is sputtered to a thickness of 5 nm by applying a DC power of 8000 W for 5 seconds to a titanium target in an argon flow 10 sccm. As titanium layer 112 is deposited, native oxide 111 is removed by gettering. In the described embodiment, titanium layer 112 has a thickness in the range of 20 to 50 Angstroms. The thickness of titanium layer 112 is chosen to be large enough to remove the native oxide 111 formed on the exposed surfaces of silicon regions 104, 105, and 110. As a result, native oxide 111 is removed by the deposition of titanium 112.

Figure 3:
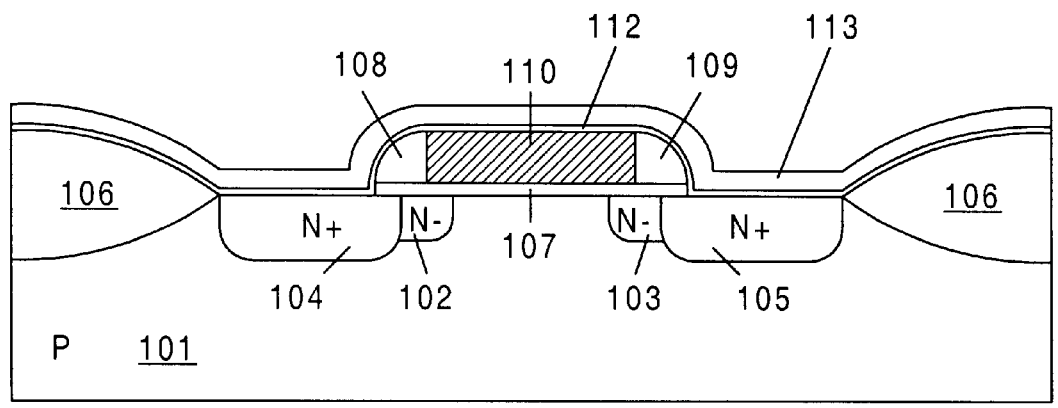

As illustrated in FIG. 3, a cobalt layer 113 is deposited over titanium layer 112, without breaking vacuum in the chamber. In the described embodiment, cobalt layer 113 is deposited by sputtering. More specifically, cobalt layer 113 is sputtered by applying a DC power of 600 W in an argon flow of 55 sccm in a deposition chamber. Cobalt layer 113 has a thickness in the range of 5 to 20 nm in the present embodiment. The thickness of cobalt layer 113 is selected such that the resulting salicide regions will be primarily cobalt salicide.

Figure 4:
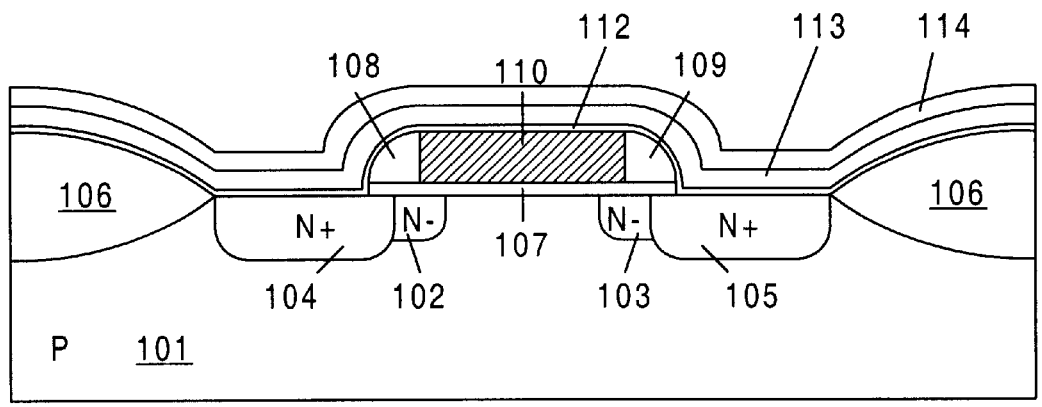
Figure 5:
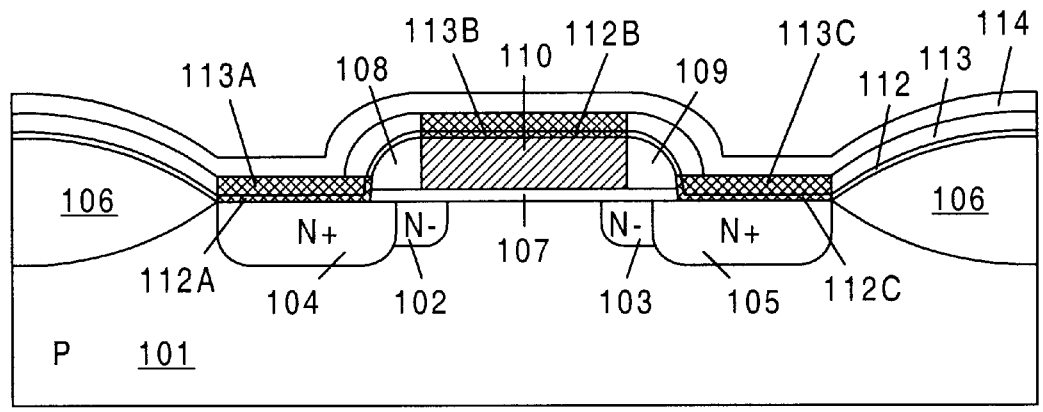

As illustrated in FIG. 4, an oxygen impervious cap layer 114 is then deposited over cobalt layer 113, without breaking vacuum in the chamber. Cap layer 114 can be formed from any material which will prevent oxygen from diffusing into cobalt layer 113 during a subsequent anneal step. In one embodiment of the present invention, cap layer 114 is a layer of titanium nitride (TiN) deposited to a thickness of 200 Angstroms. Such a TiN cap layer can be sputtered by applying a DC power of 6500 W to a titanium target in a gas mixture of 80 sccm nitrogen and 40 sccm argon. In another embodiment, cap layer 114 is a layer of titanium deposited to a thickness of about 80 to 100 Angstroms. Such a titanium cap layer is sputtered to a thickness of 10 nm by applying a DC power of 8000 W for 10 seconds to a titanium target in an argon flow of 10 sccm. Note that there is an absence of oxygen during the deposition of cap layer 114. The resulting structure is removed from the vacuum chamber and a rapid thermal anneal (RTA) is subsequently performed. In one embodiment, the RTA is performed at 450–550 degrees C. for 30 seconds. Because oxygen cannot readily diffuse through cap layer 114, the RTA need not be performed in an environment wherein ambient oxygen can be pumped down to miniscule amounts or zero.

During the RTA, the portions of titanium layer 112 and cobalt layer 113 located over regions 104, 105 and 110 are reacted with the underlying silicon, thereby forming metal salicide regions. More specifically, titanium layer 112 and cobalt layer 113 react with source/drain region 104 to form titanium salicide region 112A and cobalt salicide region 113A. In addition, titanium layer 112 and cobalt layer 113 react with polysilicon structure 110 to form titanium salicide region 112B and cobalt salicide region 113B. Polysilicon structure 110, titanium salicide region 112B and cobalt salicide region 113B form a gate electrode of the resulting transistor structure. Finally, titanium layer 112 and cobalt layer 113 react with source/drain region 105 to form titanium salicide region 112C and cobalt salicide region 113C.

Because oxygen does not enter cobalt layer 113 during the RTA step, there is no degradation of the interface between the metal salicide and the polysilicon in the resulting structure. By eliminating the native oxide 111 and preventing the formation of oxide during the anneal step, cobalt layer 113 does not tend to form cobalt salicide spikes which extend down through gate oxide 107 and into semiconductor region 101. In addition, it is believed that thin titanium layer 112 prevents cobalt layer 113 from diffusing at the cobalt-silicon interfaces. As a result, the integrity of gate oxide layer 107 is maintained, and there is no direct leakage path between the gate electrode and semiconductor region 101.

Figure 6:
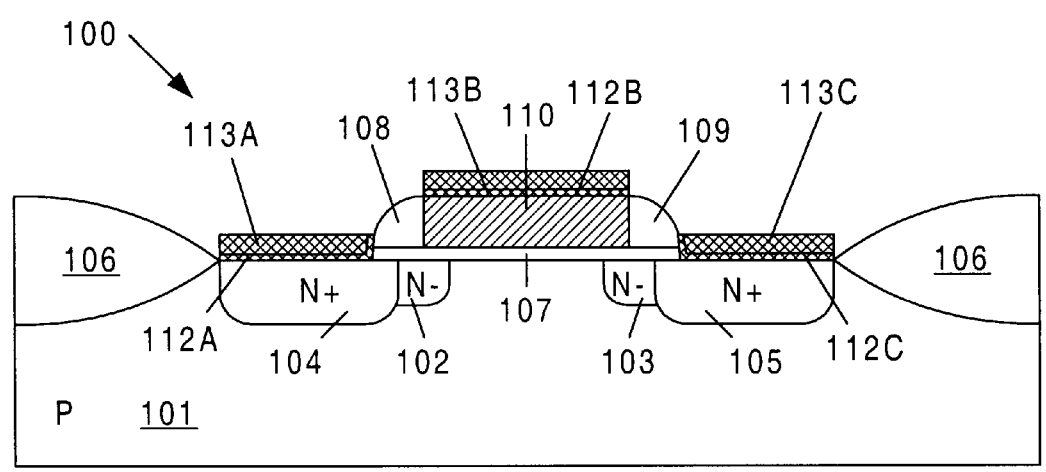

As illustrated in FIG. 6, cap layer 114 and the unreacted portions of cobalt layer 113 and thin titanium layer 112 are removed by a mixture of $H_2O$, 30% $H_2O_2$ and $NH_4OH$ (5:1:1) and then another mixture of $H_2O_2$ and $H_2SO_4$ (1:1), thereby completing the fabrication of transistor structure 100. The metal salicide formed in this structure advantageously exhibits a relatively low sheet resistance for a narrow line width, as is characteristic of cobalt salicide. However, the process avoids problems commonly encountered with native oxide when attempting to form cobalt salicide. Advantageously, the present invention does not significantly increase process complexity.

Although the present invention has been described in connection with several embodiments, it is understood that this invention is not limited to the embodiments disclosed, but is capable of various modifications which would be apparent to one of ordinary skill in the art. For example, although the described transistor 100 is an n-channel transistor, it is understood that the present invention is applicable to other semiconductor structures (e.g., p-channel transistors) that include a salicide structure. Moreover, although the various layers have been described as having particular thicknesses, it is understood that the thicknesses of the individual layers can be independently varied and tailored to meet the requirements of the resulting semiconductor devices. Thus, the invention is limited only by the following claims.

What is claimed is:

1. A method of forming a cobalt salicide structure, the method comprising the steps of:
   forming a silicon structure, wherein a native oxide is located over a first surface of the silicon structure;
   loading the silicon structure into a chamber;
   introducing a vacuum to the chamber; then
   depositing a titanium layer over the first surface of the silicon structure, wherein the thickness of the titanium layer is selected to remove substantially all of the native oxide;
   depositing a cobalt layer over the titanium layer;
   depositing an oxygen impervious cap layer over the cobalt layer; and then
   breaking the vacuum in the chamber; and
   annealing the silicon structure, the titanium layer, the cobalt layer and the cap layer, thereby forming the cobalt salicide structure.

2. The method of claim 1, wherein the cap layer comprises titanium or titanium nitride.

3. The method of claim 1, wherein the aneal is a rapid thermal anneal (RTA).

4. The method of claim 1, wherein the cobalt salicide structure has a minimum feature size less than 0.25 microns.

5. The method of claim 1, wherein the silicon structure comprises conductively doped polysilicon.

6. The method of claim 1, wherein the titanium layer is deposited to a thickness in the range of 2 to 5 nm.

7. The method of claim 1, wherein the cobalt layer is deposited to a thickness in the range of 5 to 20 nm.

8. The method of claim 1, wherein the cobalt salicide structure forms a gate electrode of a transistor.

9. The method of claim 1, wherein the cobalt salicide structure forms a portion of a source region of a transistor.

10. The method of claim 1, wherein the anneal is performed at a temperature in the range of 450 to 550° C.

11. A method of forming a cobalt salicide structure, the method comprising the steps of:

forming a silicon structure, wherein a native oxide is located over a first surface of the silicon structure;

loading the silicon structure into a chamber;

introducing a vacuum to the chamber; then depositing a titanium layer to a thickness in the range of 2 to 5 nm over the first surface of the silicon structure;

depositing a cobalt layer over the titanium layer;

depositing an oxygen impervious cap layer over the cobalt layer; and then breaking the vacuum in the chamber; and annealing the silicon structure, the titanium layer, the cobalt layer and the cap layer, thereby forming the cobalt salicide structure, wherein the titanium layer prevents the cobalt layer from diffusing at interfaces of the cobalt layer and the silicon structure.

12. The method of claim 11, wherein the cap layer comprises titanium or titanium nitride.

13. The method of claim 11, wherein the anneal is a rapid thermal anneal (RTA).

14. The method of claim 11, wherein the cobalt salicide structure has a minimum feature size less than 0.25 microns.

15. The method of claim 11, wherein the silicon structure comprises conductively doped polysilicon.

16. The method of claim 11, wherein the cobalt layer is deposited to a thickness in the range of 5 to 20 nm.

17. The method of claim 11, wherein the cobalt salicide structure forms a gate electrode of a transistor.

18. The method of claim 11, wherein the cobalt salicide structure forms a portion of a source region of a transistor.

19. The method of claim 11, wherein the anneal is performed at a temperature in the range of 450 to 550° C.

\* \* \* \* \*